US010949164B2

(12) United States Patent
Chen et al.

(10) Patent No.: US 10,949,164 B2
(45) Date of Patent: Mar. 16, 2021

(54) VOLUME OF SOUND ADJUSTMENT METHOD, ELECTRONIC DEVICE THEREOF AND NON-TRANSITORY COMPUTER READABLE STORAGE MEDIUM DEVICE THEREOF

(71) Applicant: ASUSTeK COMPUTER INC., Taipei (TW)

(72) Inventors: Yen-Ling Chen, Taipei (TW); Pu-Chien Lee, Taipei (TW); Jen-Pang Hsu, Taipei (TW); Chao-Hsien Huang, Taipei (TW); Chih-Hsien Yang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/792,927

(22) Filed: Feb. 18, 2020

(65) Prior Publication Data

US 2020/0272411 A1 Aug. 27, 2020

(30) Foreign Application Priority Data

Feb. 23, 2019 (TW) ................................ 108106191

(51) Int. Cl.
*G06F 3/16* (2006.01)
*H04R 29/00* (2006.01)
*G10L 25/51* (2013.01)

(52) U.S. Cl.
CPC .............. *G06F 3/165* (2013.01); *G10L 25/51* (2013.01); *H04R 29/001* (2013.01); *H04R 2430/01* (2013.01)

(58) Field of Classification Search
CPC ........... H03G 3/32; G06F 3/165; G10L 25/51; H04R 29/001; H04R 2430/01
USPC .................... 381/57, 56, 73.1, 102–106, 120
See application file for complete search history.

(56) References Cited

U.S. PATENT DOCUMENTS

| | | | | |
|---|---|---|---|---|
| 8,116,464 | B2 | 2/2012 | Chen et al. | |
| 9,349,385 | B2 | 5/2016 | Hu et al. | |
| 2010/0166196 | A1* | 7/2010 | Chen | H03G 3/32 381/57 |
| 2014/0233761 | A1* | 8/2014 | Hu | G10L 21/034 381/107 |

FOREIGN PATENT DOCUMENTS

| | | | |
|---|---|---|---|
| CN | 105744045 | A | 7/2016 |
| TW | 200644697 | A | 12/2006 |
| TW | 201026014 | A | 7/2010 |
| TW | 201514971 | A | 4/2015 |
| TW | I545556 | B | 8/2016 |

* cited by examiner

*Primary Examiner* — Norman Yu
(74) *Attorney, Agent, or Firm* — McClure, Qualey & Rodack, LLP

(57) ABSTRACT

A volume of sound adjustment method includes the following steps: outputting an audio with a played volume; detecting a volume of environmental noise; comparing the volume of environmental noise with a setting volume, and setting the lower one as a first target volume and setting the higher one as a second target volume; and gradually adjusting the played volume from the first target volume to the second target volume at an adjusting speed. In addition, an electronic device for adjusting a volume and a non-transitory computer readable storage medium device are also disclosed.

13 Claims, 8 Drawing Sheets

VOLUME OF SOUND ADJUSTMENT METHOD, ELECTRONIC DEVICE THEREOF AND NON-TRANSITORY COMPUTER READABLE STORAGE MEDIUM DEVICE THEREOF

This application claims the priority benefit of Taiwan Application Serial No. 108106191, filed on Feb. 23, 2019. The entirety of the above-mentioned patent application is hereby incorporated by reference herein and made a part of specification.

BACKGROUND OF THE INVENTION

Field of the Invention

The disclosure relates to a volume of sound adjustment method for an electronic device.

Description of the Related Art

Mobile devices are widely used in daily life, and the portability allow users to enjoy audio service anywhere which increases a better user experience. This feature also brings demands of adjusting a volume of sound to an appropriate level based on different occasions to avoid missing any sound notifications while enjoying audio applications by mobile devices.

BRIEF SUMMARY OF THE INVENTION

According to the first aspect, a volume of sound adjustment method applied to an electronic device is provided. The volume of sound adjustment method includes the following steps: outputting an audio with a played volume; detecting a volume of environmental noise; comparing the volume of environmental noise with a setting volume, and setting the lower one of the volume of environmental noise and the setting volume as a first target volume and setting the higher one as a second target volume; and gradually adjusting the played volume from the first target volume to the second target volume at an adjusting speed.

According to the second aspect, an electronic device is provided. The electronic device includes: an audio output element configured to output an audio with a played volume; a microphone configured to detect a volume of environmental noise; a storage device configured to store a setting volume; and a processor electrically connected to the microphone, the audio output element, and the storage device, wherein the processor is configured to perform the following steps: comparing the volume of environmental noise with the setting volume, setting the lower one of the volume of environmental noise and the setting volume as a first target volume and setting the higher one as a second target volume; and controlling the audio output element to gradually adjust the played volume from the first target volume to the second target volume at an adjusting speed.

According to the third aspect, a non-transitory computer readable storage medium device configured to store a plurality of program codes is provided. When the electronic device loads and executes these program codes, the following steps are performed: outputting an audio with a played volume; detecting a volume of environmental noise; comparing the volume of environmental noise with a setting volume, and setting the lower one of the volume of environmental noise and the setting volumes as a first target volume and setting the higher one as a second target volume; and gradually adjusting the played volume from the first target volume to the second target volume at an adjusting speed.

BRIEF DESCRIPTION OF THE DRAWINGS

To make the foregoing and other objectives, features, advantages, and embodiments of the disclosure more comprehensible, descriptions of the accompanying drawings are as follows.

DETAILED DESCRIPTION OF THE EMBODIMENTS

Figure 1:
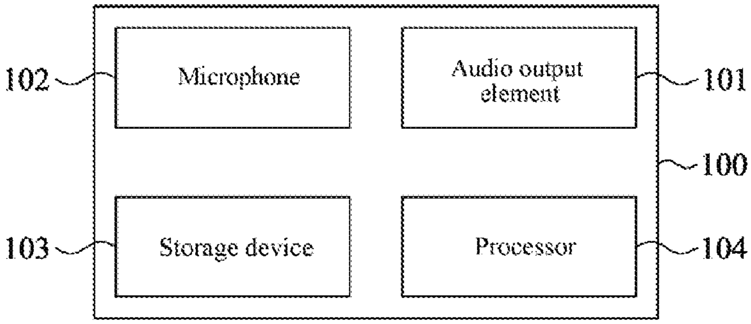
FIG. 1 is a schematic block diagram of a portable electronic device according to some embodiments of the disclosure.

FIG. 1 is a schematic block diagram of a portable electronic device according to some embodiments of the disclosure. Referring to FIG. 1, an electronic device 100 includes an audio output element 101, a microphone 102, a storage device 103, and a processor 104. In this embodiment, for example, the electronic device 100 is a smartphone, a notebook computer, a wearable electronic device, a tablet computer, a personal digital assistant (PDA), or a non-smartphone.

In this embodiment, the audio output element 101 is configured to output an audio with a played volume. In an embodiment, the audio is a ringtone or a media audio, and the audio output element is an electronic element such as a loudspeaker that is used by the electronic device to output an audio.

In an embodiment, the microphone 102 is configured to detect a volume of environmental noise of the electronic device 100, and the microphone is configured to detect an audio.

In this embodiment, for example, the storage device 103 is a memory, a hard disk, or a portable disc memory card.

In this embodiment, the processor 104 is electrically connected to the audio output element 101, the microphone 102, and the storage device 103. The processor 104 is a microcontroller, a microprocessor, a digital signal processor, an application specific integrated circuit (ASIC), or a logical circuit.

Figure 2A:
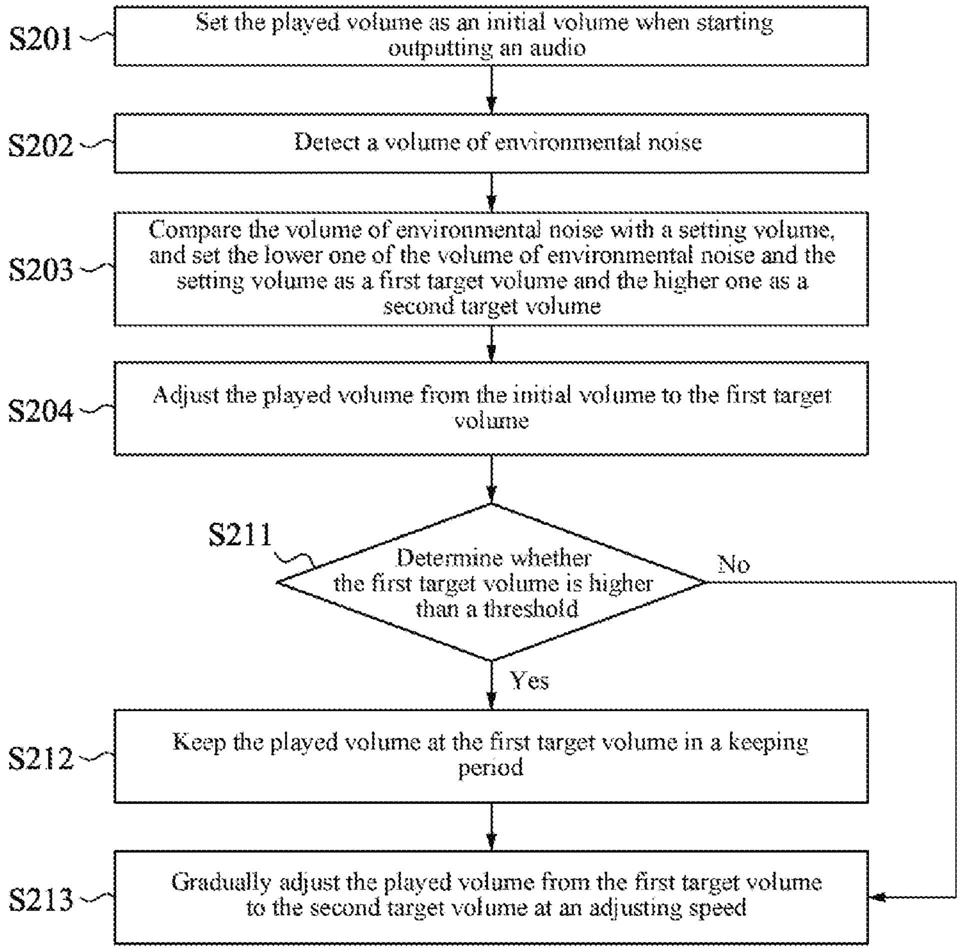
FIG. 2A is a flowchart of a volume of sound adjustment method according to some embodiments of the disclosure.

Referring to FIG. 1, FIG. 2A, FIG. 3, FIG. 4, and FIG. 5, in some embodiments of the disclosure, the flow shown in FIG. 2A is performed by the portable electronic device 100 shown in FIG. 1.

Figure 3:
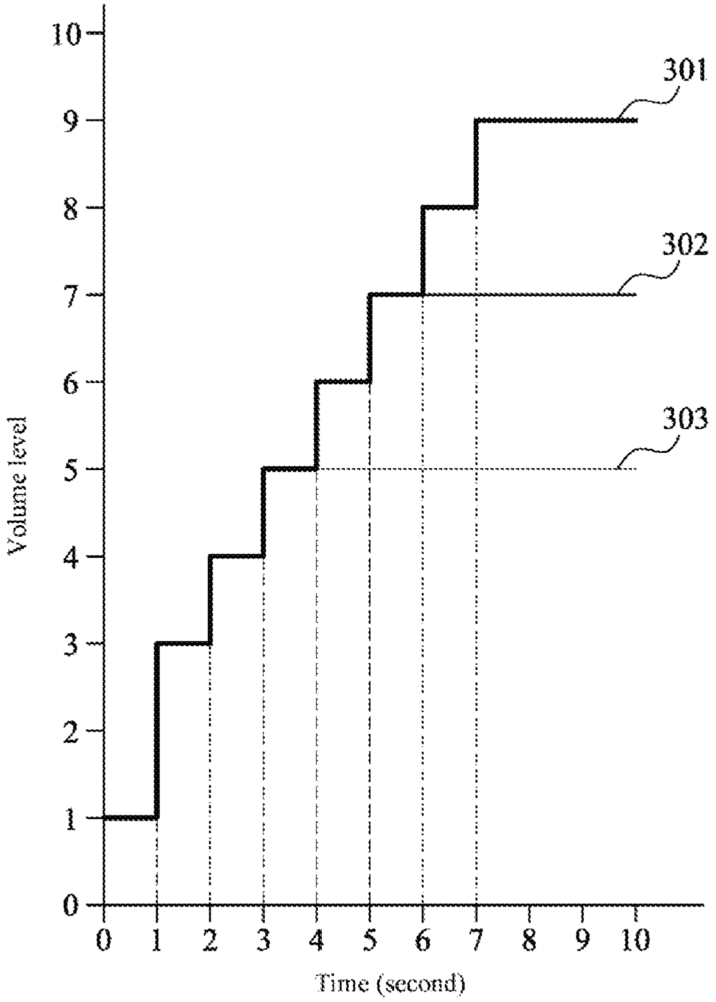
FIG. 3 is a schematic diagram of a volume adjustment status according to some embodiments of the disclosure.
Figure 4:
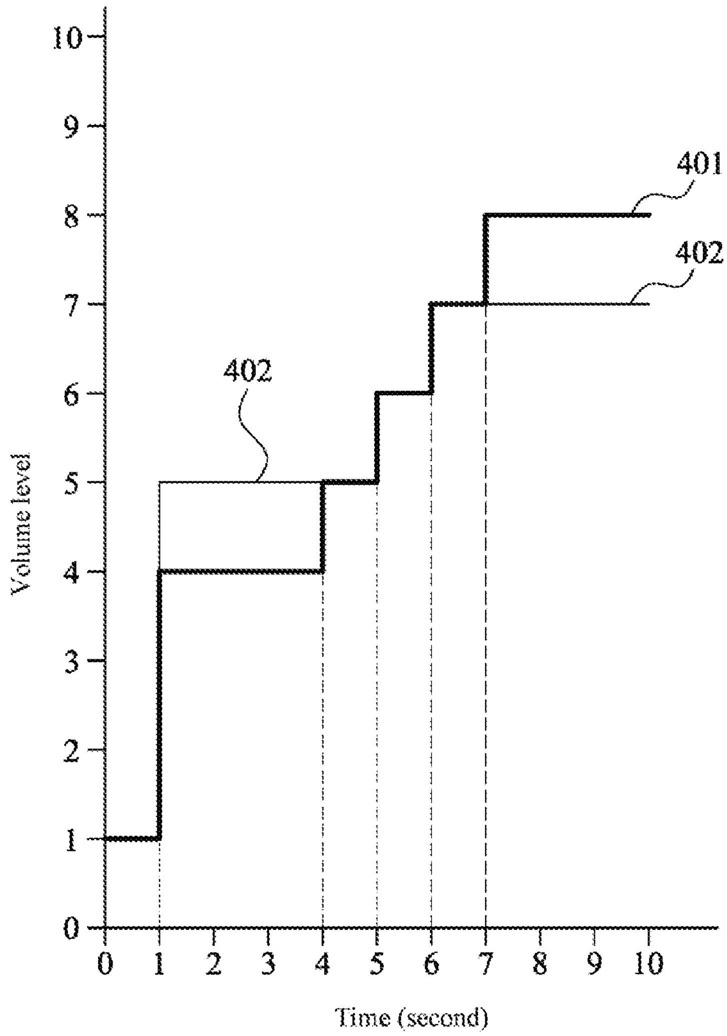
FIG. 4 is a schematic diagram of a volume adjustment status according to some embodiments of the disclosure.
Figure 5:
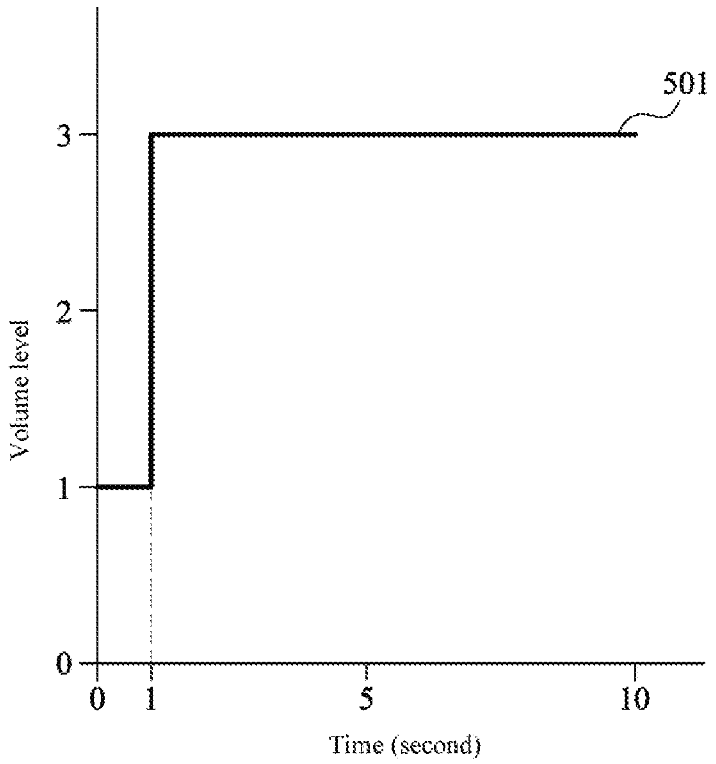
FIG. 5 is a schematic diagram of a volume adjustment status according to some embodiments of the disclosure.

Referring to FIG. 1 and FIG. 2A, in step S201, the electronic device 100 outputs the audio with a played volume through the audio output element 101. In an embodiment, the electronic device 100 is a smartphone, and the audio is a ringtone for an incoming call. In another embodiment, the electronic device 100 is a notebook computer, and the audio is a media audio outputted by the notebook computer. Referring to FIG. 3, FIG. 4 and FIG. 5, the $0^{th}$ second shown in FIG. 3, FIG. 4 and FIG. 5 represents a time when the electronic device 100 in this embodiment starts outputting the audio with the played volume.

Referring to FIG. 1 and FIG. 2A, in step S201, the played volume is set as an initial volume when the electronic device 100 start outputting the audio. In some embodiments, the initial volume is a lowest volume of the electronic device 100 or another proper volume as shown in a section from the $0^{th}$ second to the first second in FIG. 3, FIG. 4, and FIG. 5. The step ensures that the played volume is at a level that does not too loud to public or become noise before the electronic device 100 adjusts the played volume.

Referring to FIG. 1 and FIG. 2A, in step S202, when the played volume is at an initial volume, the electronic device 100 turns on the microphone 102 to detect the volume of environmental noise of the electronic device 100, as shown in the section from the $0^{th}$ second to the first second in FIG. 3, FIG. 4, and FIG. 5.

In order to make the played volume conform to the volume that originally set by a user, and provide a quiet environment for users to calmly handle things related to the outputted audio (such as ringing phones and playing media with an audio), or immediately notice incoming audio applied events even in a noisy environment, in some embodiments of the disclosure, the volume of sound adjustment method includes step S203. In step S203, the electronic device 100 compares the volume of environmental noise detected by the microphone 102 with the setting volume stored by the storage device 103 through the processor 104, and sets the lower one of the volume of environmental noise and the setting volume as a first target volume and the higher one as a second target volume. In an embodiment, the setting volume is a volume that the user is accustomed to. In another embodiment, the setting volume is a public acceptable volume that preset in the electronic device 100. As shown in the section from the $0^{th}$ second to the first second in FIG. 3, FIG. 4, and FIG. 5, in this case, the processor 104 sets the played volume as the initial volume to output, and also sets the first target volume and the second target volume.

Referring to FIG. 1 and FIG. 2A, in some embodiments, after the first target volume and the second target volume are set, the electronic device 100 continues to perform step S204. In step S204, the processor 104 controls the audio output element 101 to adjust the played volume from the initial volume to the first target volume, as shown in a section of the first second in FIG. 3, FIG. 4, and FIG. 5. In this embodiment, an operation of step S204 shows that the played volume is directly changed into the first target volume at the first second. However, the operation of step S204 on when and how to adjust the played volume from the initial volume to the first target volume is not limited herein. In another embodiment, in step S204, the processor 104 gradually adjusts the played volume from the initial volume to the first target volume at any time after the first target volume and the second target volume are set.

Referring to FIG. 3, a fold line 301 represents a volume adjustment status in an embodiment that the initial volume is 1, the first target volume is 3, and the second target volume is 9. A fold line 302 represents a volume adjustment status in an embodiment that the initial volume is 1, the first target volume is 3, and the second target volume is 7. A fold line 303 represents a volume adjustment status in an embodiment that the initial volume is 1, the first target volume is 3, and the second target volume is 5. In these embodiments, when the first target volume is the setting volume, the second target volume is the volume of environmental noise. Similarly, when the first target volume is the volume of environmental noise, the second target volume is the setting volume. In an embodiment, the initial volume is lower than the setting volume and the volume of environmental noise.

In some embodiments, in the disclosure, when the first target volume is a little higher than the general acceptable volume but is the setting volume that the user is accustomed to, the played volume is temporarily kept at the first target volume in a period of time, so that the played volume does not suddenly change from the first target volume to the louder second target volume during a volume adjustment period, and is able to be heard by the user. Referring to FIG. 2A, in some embodiments of the disclosure, the volume of sound adjustment method includes step S211. In step S211, the electronic device 100 determines, through the processor 104, whether the first target volume is higher than or equal to a threshold preset by the processor 104. The threshold is not limited, and in an embodiment, the threshold is a volume acceptable by the general public. FIG. 3 and FIG. 4 both show a volume adjustment status when the threshold is 4, but this is merely exemplary. The threshold is not limited herein. The operations related to the threshold are explained in more detail below.

Referring to FIG. 1 and FIG. 2A, the processor 104 determines whether the first target volume is higher than or equal to the threshold in step S211. When the processor 104 determines that the first target volume is lower than the threshold and the played volume is the first target volume, the processor 104 continues to perform step S213. In step S213, the processor 104 controls the audio output element 101 to gradually adjust the played volume from the first target volume to the second target volume at an adjusting speed. As shown in a section after the first second in FIG. 3, in some embodiments, the aforementioned "gradually adjusting the volume at an adjusting speed" refers to that the processor 104 controls the audio output element 101 to turn up the volume by one level each time interval. In this embodiment, the fold line 301, the fold line 302, and the fold line 303 are all represent gradual adjustment statuses to turn up the volume by one level each time interval (unit time interval), but these are merely exemplary and not intended to limit a speed or an operation of the gradual adjustment. In an embodiment, the played volume is turned up by one level every 0.25 seconds (unit time interval) or 1.83 seconds (unit time interval), or the played volume is turned up by two levels every 1 second. The setting of the adjusting speed is explained in detail below.

Referring to FIG. 1 and FIG. 2A, in step S211, when the processor 104 determines that the first target volume is higher than or equal to the threshold and the played volume is the first target volume, the processor 104 continues to perform step S212. In step S212, the processor 104 controls the audio output element 101 to keep the played volume at the first target volume in a keeping period. Then, after the keeping period, the electronic device 100 performs step S213. Referring to FIG. 4, a fold line 401 represents a volume adjustment status in an embodiment that the first target volume is 4, the second target volume is 8, and the threshold is 4. A fold line 402 represents a volume adjustment status in an embodiment that the first target volume is 5, the second target volume is 7, and the threshold is 4. As shown in a section of the fold line 401 from the first second to the fourth second, because the processor 104 determines that the first target volume (which is 4 in this embodiment) is equal to the threshold (which is 4 in this embodiment)

when performing step S211, the processor 104 continues to perform step S212 and adjusts and keeps the played volume at the first target volume (in this embodiment, the first target volume is 4) in a keeping period (in this embodiment, the keeping period is set to 3 seconds). In another embodiment, as shown in a section of the fold line 402 from the first second to the fourth second, because the processor 104 determines that the first target volume (in this embodiment, the first target volume is 5) is higher the threshold (in this embodiment, the threshold is 4) when performing step S211, the processor 104 continues to perform step S212 to adjust and keep an output volume of the audio at the first target volume (in this embodiment, the first target volume is 5) in a keeping period (the keeping period is set for 3 seconds in this embodiment). The foregoing description is merely exemplary and not intended to limit the duration of the keeping period. By an operation of keeping the played volume at the threshold in a keeping period, the user has more time to deal with things related to the audio when the first target volume is higher than the threshold.

In these embodiments, when the first target volume is the setting volume, the second target volume is the volume of environmental noise. Similarly, when the first target volume is the volume of environmental noise, the second target volume is the setting volume.

In an embodiment, the processor 104 sets a duration of the keeping period to a constant value. In another embodiment, step S212 further includes the following implementation: The processor 104 of the electronic device 100 sets the duration of the keeping period according to the volume of environmental noise. In an embodiment, when the volume of environmental noise is lower, the duration of the keeping period is longer; otherwise, when the volume of environmental noise is higher, the duration of the keeping period is shorter.

The foregoing description is merely exemplary and not intended to limit the duration of the keeping period. By an operation of keeping the played volume at the threshold in a keeping period, the user has more time to deal with things related to the audio when the first target volume is higher than the threshold.

Referring to FIG. 5, a fold line 501 represents a volume adjustment status in an embodiment that the first target volume is 3 and the second target volume is also 3. That is, the fold line 501 represents a status in an embodiment that the setting volume and the volume of environmental noise are both 3.

Referring to FIG. 3, in an embodiment, the fold line 301, the fold line 302, and the fold line 303 represent statuses that the first target volume is gradually adjusted to the second target volume after the first second. However, this is merely exemplary and not intended to limit step S211 on when to adjust the played volume from the first target volume to the second target volume. In an embodiment, in step S211, the processor 104 also gradually adjusts the played volume from the first target volume to the second target volume at any time after the played volume is adjusted from the initial volume to the first target volume. In an embodiment, the initial volume is lower than the first target volume and the second target volume.

Referring to FIG. 3, as shown in a section of the fold line 301 after the seventh second, a section of the fold line 302 after the fifth second, and a section of the fold line 303 after the third second, in some embodiments, when the played volume is gradually adjusted to the second target volume, it keeps at the second target volume.

Referring to FIG. 5, the fold line 501 represents a volume adjustment status in an embodiment that the first target volume and the second target volume are both 3. As shown in a section of the fold line 501 after the first second, in some embodiments, when the value of the first target volume is equal to the value of the second target volume, the played volume is kept as the first target volume after step S204.

Figure 2B:
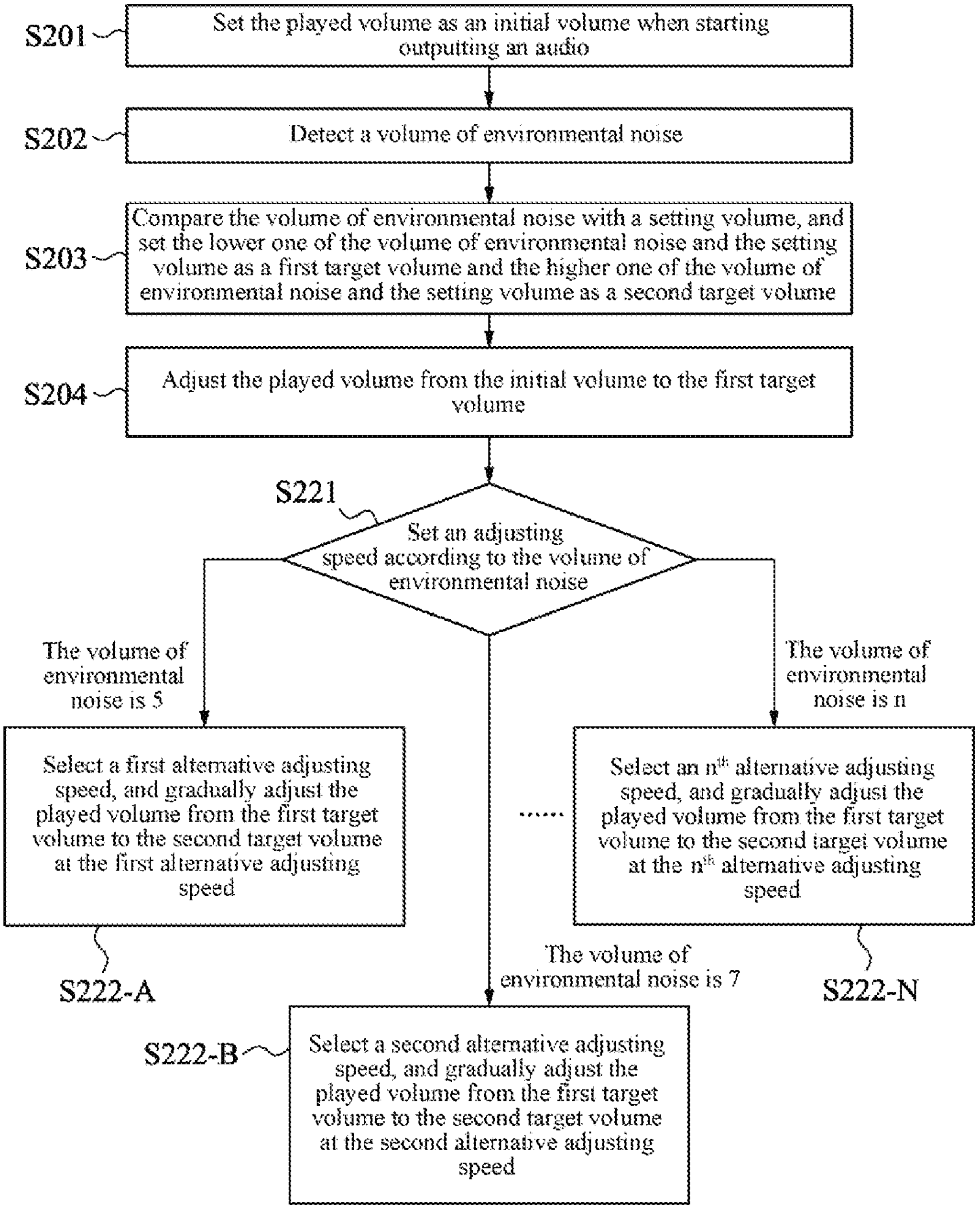
FIG. 2B is a flowchart of a volume of sound adjustment method according to some embodiments of the disclosure.

FIG. 2B is a flowchart of a volume of sound adjustment method according to some embodiments of the disclosure. The flow shown in FIG. 2B is performed by the electronic device 100 shown in FIG. 1.

Figure 6:
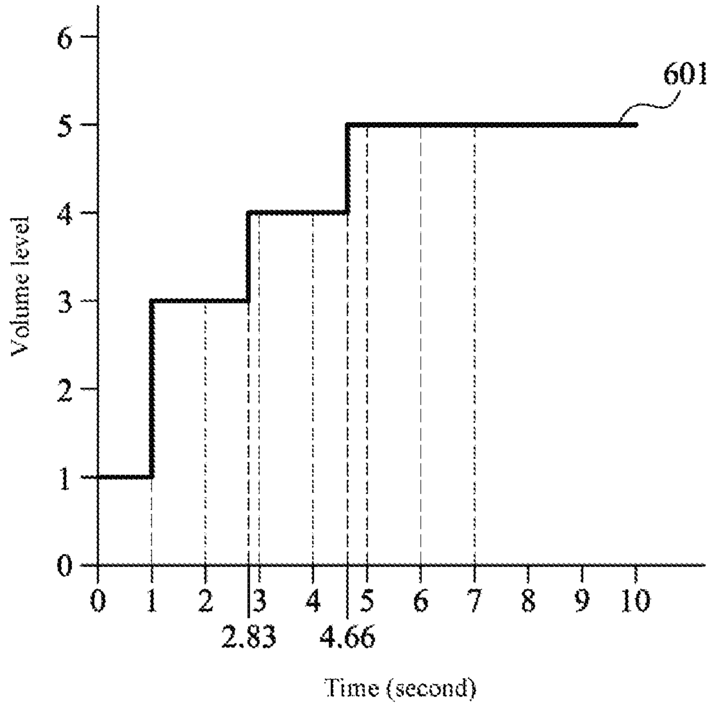
FIG. 6 is a schematic diagram of a volume adjustment status according to some embodiments of the disclosure.
Figure 7:
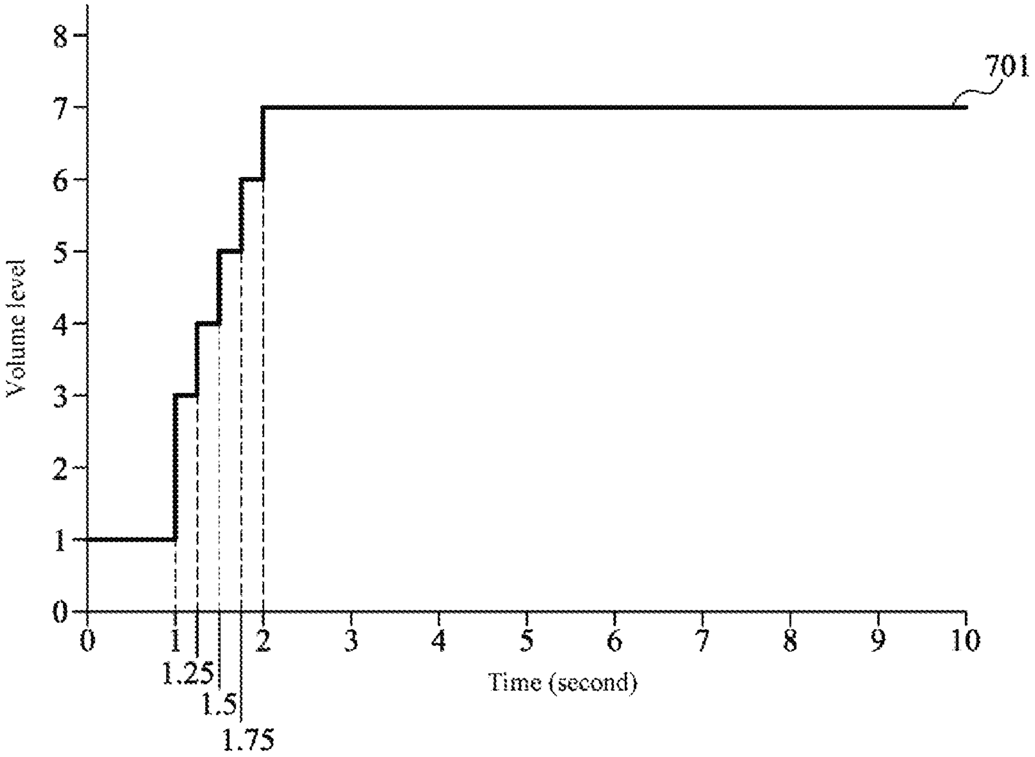
FIG. 7 is a schematic diagram of a volume adjustment status according to some embodiments of the disclosure.

The following illustrates some embodiments of the disclosure with reference to FIG. 1, FIG. 2B, FIG. 6, and FIG. 7. FIG. 6 and FIG. 7 are schematic diagrams of volume adjustment statuses according to some embodiments of the disclosure.

Referring to FIG. 2B, in some embodiments, the volume of sound adjustment method includes the following steps. Steps S201 to S204 are shown in sections from the $0^{th}$ to the first second in FIG. 6 and FIG. 7.

Referring to FIG. 1 and FIG. 2B, in step S201, the electronic device 100 starts outputting the audio with a played volume through the audio output element 101. Referring to FIG. 6 and FIG. 7, the $0^{th}$ second shown in FIG. 6 and FIG. 7 represents a time when the electronic device 100 in this embodiment starts outputting the audio. In step S201, the played volume is set as an initial volume when the electronic device 100 starts outputting the audio. As shown in the section from the $0^{th}$ second to the first second in FIG. 6 and FIG. 7, the initial volume is 1.

Referring to FIG. 1 and FIG. 2B, in step S202, at the beginning of outputting the audio at the initial volume, the electronic device 100 turns on the microphone 102 to detect the volume of environmental noise of the electronic device 100, as shown in the section from the $0^{th}$ second to the first second in FIG. 6 and FIG. 7.

Referring to FIG. 1 and FIG. 2B, in step S203, the electronic device 100 compares the volume of environmental noise detected by the microphone 102 with the setting volume stored by the storage device 103 through the processor 104, and sets the lower one as a first target volume and the higher one as a second target volume. As shown in the section from the $0^{th}$ second to the first second in FIG. 6 and FIG. 7, in this case, the audio is outputted at the initial volume, and the processor 104 sets the first target volume and the second target volume at the same time.

Referring to FIG. 1 and FIG. 2B, in some embodiments, when the first target volume and the second target volume are set, the electronic device 100 continues to perform step S204. In step S204, the processor 104 controls the audio output element 101 to adjust the played volume from the initial volume to the first target volume, as shown in a section of the first second in FIG. 6 and FIG. 7.

Proceeding from step S204, in an embodiment of the disclosure, the volume of sound adjustment method includes step S221. In step S221, the electronic device 100 sets, through the processor 104, an adjusting speed according to the volume of environmental noise detected by the microphone 102. In some embodiments, the processor 104 selects one alternative adjusting speed from a plurality of alternative adjusting speeds (a first alternative adjusting speed to an $n^{th}$ alternative adjusting speed shown in FIG. 2B) stored in the storage device 103 as the adjusting speed of the played volume. Referring to FIG. 2B, FIG. 6, and FIG. 7, a fold line 601 represents a status that the volume of environmental noise is 5, and the processor 104 selects the first alternative adjusting speed stored in the storage device 103. A fold line

701 represents a status that the volume of environmental noise is 7, and the processor 104 selects a second alternative adjusting speed stored in the storage device 103. An operation of setting corresponding adjusting speeds according to different volume of environmental noises is described in detail below.

As shown in a section after the first second in FIG. 6 and FIG. 7, in some embodiments of the disclosure, the volume of sound adjustment method includes steps S222-A to S222-N. In some embodiments, after selecting the alternative adjusting speed according to the volume of environmental noise, the processor 104 continues to perform one of steps S222-A to S222-N to adjust the played volume from the first target volume to the second target volume at the alternative adjusting speed.

Referring to FIG. 6, in an embodiment, the fold line 601 represents a status that the adjusting speed is set to turn up the played volume by one level every 1.83 seconds. As shown in the section after the first second in FIG. 6, in this embodiment, the electronic device 100 is located in a quiet environment, and a volume of environmental noise detected in this environment is a first volume (such as: 5). By an operation of setting the adjusting speed according to the volume of environmental noise, the first alternative adjusting speed is selected from the plurality of alternative adjusting speeds stored in the storage device 103 as the adjusting speed.

Referring to FIG. 7, the fold line 701 represents a status that in some embodiments, the adjusting speed is set to turn up the played volume by one level every 0.25 seconds. As shown in the section after the first second in FIG. 7, in this embodiment, the electronic device 100 is located in a noisy environment, and a volume of environmental noise detected in this environment is a second volume (such as: 7). By an operation of setting the adjusting speed according to the volume of environmental noise, the second alternative adjusting speed is selected from the plurality of alternative adjusting speeds stored in the storage device 103 as the adjusting speed.

Referring to FIG. 6 and FIG. 7 at the same time, the volume of environmental noise (such as the first volume) in the embodiment shown in FIG. 6 is lower than the volume of environmental noise (such as the second volume) in the embodiment shown in FIG. 7, and the adjusting speed (such as the first alternative adjusting speed) in the embodiment shown in FIG. 6 is slower than the adjusting speed (such as the second alternative adjusting speed) in the embodiment shown in FIG. 7. Therefore, in the volume of sound adjustment method according to the disclosure, the fold line 701 spends less time than the fold line 601 to be adjusted to the second target volume (which is 7 in this embodiment), so that the user immediately notices incoming audio applied events even in a noisy environment (for example, an incoming message notification or a phone call).

In some embodiments, the volume of sound adjustment method according to any embodiment in the disclosure is implemented by a non-temporary storage readable memory medium device. The non-temporary storage readable memory medium device stores a plurality of program codes, and when the electronic device 100 loads and executes these program codes, these program codes enable the electronic device 100 to perform the volume of sound adjustment method according to any one of the foregoing embodiments. In an embodiment, the non-temporary storage readable memory medium device is the storage device 103 in the electronic device 100.

In the foregoing embodiments, the alternative adjusting speed and the corresponding volume of environmental noise are in a positive correlation, that is, a higher volume of environmental noise indicates a faster corresponding alternative adjusting speed. By this operation, a speed at which the audio volume is adjusted upwards decreases as the detected volume of environmental noise decreases. Compare to adjust the played volume at a fixed adjusting speed, the user has more time to deal with the audio outputted by the electronic device 100 before the volume is turned up to annoy others, so that the user is calmer in a quiet environment.

Similarly, a speed that the audio volume turned up increases as the detected volume of environmental noise increases. Compare to adjust the played volume at a fixed adjusting speed, the user notices the audio played by the electronic device 100 more immediately, so that the user immediately notices incoming audio applied events even in a noisy environment.

In conclusion, a method for adjusting the output volume of the audio (such as a ringtone or a media audio) of the electronic device carried by the user according to the noise volume of the environment at which the user is located is disclosed in the disclosure. In an embodiment, volume of environmental noise, the electronic device detects the volume of environmental noise and gradually adjusts the ringtone volume from the volume of environmental noise to a user preset volume when the user is in a quiet environment (such as a library or a hospital ward) and the volume of environmental noise is lower than a ringtone volume set by the user, so that the user answers the phone more calmly without disturbing the surrounding people with an excessively high ringtone volume, which also conforms to the volume originally set by the user. Similarly, when the user is in a noisy environment (such as a busy subway station or a concert), and when the volume of environmental noise is higher than a user default ringtone volume, the electronic device detects the volume of environmental noise and gradually adjusts the ringtone volume from the user default ringtone volume to the volume of environmental noise, so that the user notices the ringtone of the electronic device in real time, which also conforms to the volume originally set by the user.

What is claimed is:

1. A volume of sound adjustment method, applied to an electronic device, wherein the volume of sound adjustment method comprises the following steps:

outputting an audio with a played volume;

detecting a volume of environmental noise;

comparing the volume of environmental noise with a setting volume, and setting the lower one of the volume of environmental noise and the setting volume as a first target volume and setting the higher one as a second target volume;

selecting the adjusting speed from a plurality of alternative adjusting speeds according to the detected volume of environmental noise;

selecting a first alternative adjusting speed from the plurality of alternative adjusting speeds as the adjusting speed when the volume of environmental noise is detected to be a first volume; and selecting a second alternative adjusting speed from the plurality of alternative adjusting speeds as the adjusting speed when the volume of environmental noise is detected to be a second volume, wherein the first volume is lower than the second volume and the first alternative adjusting speed is slower than the second alternative adjusting speed; and gradually adjusting the played volume from the first target volume to the second target volume at an adjusting speed.

2. The volume of sound adjustment method according to claim 1, wherein in the step of outputting the audio, the played volume is set as an initial volume, and the initial volume is lower than the volume of environmental noise and the setting volume.

3. The volume of sound adjustment method according to claim 2, wherein before gradually adjusting from the first target volume to the second target volume at the adjusting speed, the volume of sound adjustment method further comprises:

adjusting the played volume from the initial volume to the first target volume.

4. The volume of sound adjustment method according to claim 1, further comprising:

gradually adjusting the played volume from the first target volume to the second target volume at the adjusting speed when the first target volume is lower than a threshold and the played volume is the first target volume.

5. The volume of sound adjustment method according to claim 1, further comprising:

adjusting and keeping the played volume at the first target volume in a keeping period when the first target volume is higher than or equal to a threshold and the played volume is the first target volume.

6. The volume of sound adjustment method according to claim 5, further comprising: adjusting a duration of the keeping period according to the volume of environmental noise.

7. The volume of sound adjustment method according to claim 5, wherein the duration of the keeping period is a constant value.

8. An electronic device, comprising:

an audio output element, configured to output an audio with a played volume;

a microphone, configured to detect a volume of environmental noise;

a storage device, configured to store a setting volume; and a processor, electrically connected to the microphone, the audio output element, and the storage device, wherein the processor is configured to perform the following steps:

comparing the volume of environmental noise with the setting volume, and setting the lower one of the volume of environmental noise and the setting volume as a first target volume and setting the higher one as a second target volume; and controlling the audio output element to gradually adjust the played volume from the first target volume to the second target volume at an adjusting speed, wherein the storage device stores a plurality of alternative adjusting speeds, and the processor selects the adjusting speed from the plurality of alternative adjusting speeds according to the detected volume of environmental noise, wherein when the volume of environmental noise is detected to be a first volume, the processor selects a first alternative adjusting speed from the plurality of alternative adjusting speeds as the adjusting speed; and when the volume of environmental noise is detected to be a second volume, the processor selects a second alternative adjusting speed from the plurality of alternative adjusting speeds as the adjusting speed, wherein the first volume is lower than the second volume and the first alternative adjusting speed is slower than the second alternative adjusting speed.

9. The electronic device according to claim 8, wherein when the processor determines that the first target volume is lower than a threshold and the played volume played by the audio output element is the first target volume, the processor gradually adjusts the played volume from the first target volume to the second target volume at the adjusting speed.

10. The electronic device according to claim 8, wherein when the processor determines that the first target volume is higher than or equal to a threshold and the played volume played by the audio output element is the first target volume, the processor controls the audio output element to keep the played volume at the first target volume in a keeping period; and after the keeping period, the processor controls the audio output element to gradually adjust the played volume from the first target volume to the second target volume at the adjusting speed.

11. The electronic device according to claim 10, wherein the processor adjusts a duration of the keeping period according to the volume of environmental noise.

12. The electronic device according to claim 10, wherein the processor sets the duration of the keeping period as a constant value.

13. A non-temporary storage readable memory medium device, storing a plurality of program codes, wherein when an electronic device loads and executes these program codes, these program codes enable the electronic device to perform the following steps:

outputting an audio with a played volume;

detecting a volume of environmental noise;

comparing the volume of environmental noise with a setting volume, and setting the lower one of the volume of environmental noise and the setting volume as a first target volume and setting the higher one as a second target volume;

selecting the adjusting speed from a plurality of alternative adjusting speeds according to the detected volume of environmental noise;

selecting a first alternative adjusting speed from the plurality of alternative adjusting speeds as the adjusting speed when the volume of environmental noise is detected to be a first volume; and selecting a second alternative adjusting speed from the plurality of alternative adjusting speeds as the adjusting speed when the volume of environmental noise is detected to be a second volume, wherein the first volume is lower than the second volume and the first alternative adjusting speed is slower than the second alternative adjusting speed; and gradually adjusting the played volume from the first target volume to the second target volume at an adjusting speed.

* * * * *